United States Patent [19]
Harris et al.

[11] Patent Number: 5,510,644
[45] Date of Patent: Apr. 23, 1996

[54] CDTE X-RAY DETECTOR FOR USE AT ROOM TEMPERATURE

[75] Inventors: Karl A. Harris, Liverpool, N.Y.; Thomas H. Myers, II, Westover, W. Va.; Robert W. Yanka, Liverpool, N.Y.

[73] Assignee: Martin Marietta Corporation, Syracuse, N.Y.

[21] Appl. No.: 311,828

[22] Filed: Sep. 23, 1994

Related U.S. Application Data

[63] Continuation of Ser. No. 142,545, Oct. 22, 1993, abandoned, which is a continuation of Ser. No. 856,410, Mar. 23, 1992, abandoned.

[51] Int. Cl.$^6$ .................... H01L 31/075; H01L 31/105; H01L 31/117
[52] U.S. Cl. .................... 257/458; 257/428; 257/436; 257/442; 257/459; 257/466; 250/370.13; 250/370.14
[58] Field of Search ................ 357/30, 29, 16, 357/58, 61, 63, 65; 250/370.13, 370.14; 257/428, 431, 436, 439, 442, 448, 458, 459, 466

[56] References Cited

U.S. PATENT DOCUMENTS

| | | | |
|---|---|---|---|
| 3,999,071 | 12/1976 | Siffert et al. | 250/370.14 |
| 4,411,728 | 10/1983 | Sakamoto | 156/606 |
| 4,435,224 | 3/1984 | Durand | 148/1.5 |
| 4,542,578 | 9/1985 | Yamano et al. | 29/572 |
| 4,700,076 | 10/1987 | Dorman et al. | 357/29 |
| 4,859,853 | 8/1989 | Kronenberg | 250/370.07 |
| 4,960,720 | 10/1990 | Shimbo | 437/105 |
| 4,960,728 | 10/1990 | Schaake et al. | 437/82 |
| 5,008,726 | 4/1991 | Nakagawa et al. | 257/458 |
| 5,028,561 | 7/1991 | Kamath et al. | 437/105 |
| 5,057,183 | 10/1991 | Tomomura et al. | 156/610 |
| 5,259,891 | 11/1993 | Matsuyama et al. | 136/244 |
| 5,281,541 | 1/1994 | Saito et al. | 437/2 |

OTHER PUBLICATIONS

Mimila–Arroyo et al., "Electric and Photovoltaic Properties of CdTe ph Homojunctions", Solar Energy Materials, 1 (1979), pp. 171 to 180.
J. Mimila–Arroyo, Y. Marfaing, G. Cohen–Solal and R. Triboulet; Electric and Photovoltaic Properties of CdTe pn Homojunctions; Solar Energy Materials/1979, pp. 171–180.
G. Entine, M. R. Squillante, H. B. Serreze and E. Clarke; Fast, High Flux, Photovoltaic CdTe Detector IEEE Transactions on Nuclear Science, vol. NS–28, No. 1/Feb. 1981, pp. 558–562.
S. H. Shin, G. T. Niizawa, J. G. Pasko, G. L. Bostrup, F. J. Ryan, M. Koshnevisan, C. I. Westmark and C. Fuller; P–I–N CdTe Gamma Ray Detectors by Liquid Phase Epitaxy (LPE); IEEE Transactions on Nuclear Science, vol. NS–32, No. 1/Feb. 1985, pp. 487–491.
R. N. Bicknell, N. C. Giles, J. F. Schetzina and C. Hitzman; Controlled Substitutional Doping of CdTe Thin Films Grown by Photoassisted Molecular–BEam EPITAXY; J. Vac. Sci. Technol. A. vol. 5, No. 5/Sep.–Oct. 1987, pp. 3059–3063.

(List continued on next page.)

Primary Examiner—Ngân V. Ngô
Attorney, Agent, or Firm—Paul Checkovich; Stephen A. Young

[57] ABSTRACT

An improved x-ray detector in the form of a p-i-n CdTe homojunction device is disclosed. The intrinsic ("i") layer is of high resistivity CdTe, while the n- and p-doped CdTe layers are epitaxially grown in a photo-assisted process in a molecular beam epitaxial apparatus. The n-dopant is conveniently indium, with an indium metal contact. The "i" layer is optionally epitaxially grown in a photo-assisted process. The p-dopant is preferably arsenic. A PAMBE formed mercury telluride contact layer enhances the ohmic contact to the p-layer, and a gold contact is provided to the contact layer. The use of the PAMBE technique facilitates high quality crystal growth and activation of the dopants. The resulting CdTe p-i-n homojunction device has a wide band gap (1.45 eV) essential to room temperature operation.

19 Claims, 1 Drawing Sheet

OTHER PUBLICATIONS

T. H. Meyers, R. W. Yanka, K. A. Harris, A. R. Reisinger, J. Hans, S. Hwang, Z. Yang, N. C. Giles, J. W. Cook, Jr., J. F. Schetzina.

T. W. Green and S. McDevitt; Properties of HgCdTe Films and Hg–Based Quantum Well Structures Grown by Photo-assisted Molecular–Beam Epitaxy; J. Vac. Sci. Technol. A. vol. 7, No. 2/Mar.–Apr. 1989, pp. 300–304.

M. R. Squillante, G. Entine, E. Frederick, L. Cirignano and T. Hazlett; Development of Two New M—n CdTe Sensors; Nuclear Instruments and Methods in Physics Research A283 (1989), pp. 323–329.

T. Hazlett, H. Cole, M. R. Squillante, G. Entine, G. Sugars, W. Fecych and O. Tench; Large, High Resolution CdTe Gamma Ray Sensors; IEEE Transactions on Nuclear Science, vol. 33, No. 1/Feb. 1986, pp. 332–336.

CDTE X-RAY DETECTOR FOR USE AT ROOM TEMPERATURE

This application is a continuation of application Ser. No. 08/142,545, filed Oct. 22, 1993, now abandoned, which is a continuation of application Ser. No. 07/856,410, filed Mar. 23, 1992, now abandoned.

BACKGROUND OF THE INVENTION

1. Field of the Invention

The invention relates to diode x-ray detectors and more particularly to cadmium telluride based diode x-ray detectors.

2. Prior Art

CdTe has been of interest for the detection of x-rays for several years. It is a particularly attractive material because of its high average atomic number (50) and high density (6.29/cc). In addition it has a large band gap (1.45 eV at 300K) which makes room temperature operation possible.

X-ray detectors based on CdTe offer greater sensitivity and a more compact design than is realized in traditional Xenon gas or scintillator based detectors. In addition, unlike most other solid state detector materials, CdTe detectors can be operated at room temperature. This can significantly decrease the complexity and cost of x-ray detection systems. However, the performance to-date of detectors fabricated in bulk CdTe has been less than ideal, primarily due to poor structural and electrical properties.

The metal-semiconductor-metal (M-S-M) structure has been the most common device configuration for commercial CdTe based, x-ray detectors. The device works on a principle similar to that of a gas arc-discharge x-ray detector. A high voltage is applied which, when incident x-rays create electron-hole pairs facilitating conduction, induces a current flow in the x-ray absorptive semiconductor placed between the metal electrodes. In general, high work function metals have been used in conjunction with high resistivity p-type bulk CdTe. This combination of materials produces low Schottky barriers at the metal-semiconductor interfaces resulting in relatively large leakage currents when a bias voltage is applied to the device. In high flux applications, the problem of leakage current is severe, since it masks currents generated by the incident radiation. In addition, traps present in the CdTe cause the photocurrent to persist after the radiation has been removed leaving an undesirable afterglow.

The problems inherent in the M-S-M structure can be overcome to a great extent through the use of photodiode x-ray detectors which operate in a manner very similar to solar cells. The photodiode x-ray detector involves junction devices, the p-i-n structure being the most appropriate to high energy radiation detection. In such devices, doped regions on either side of the intrinsic region, under the influence of smaller reverse biases than in the M-S-M structures, create a depletion region in which electron-hole pairs can be created by incident x-rays under more exactly controlled conditions. Such devices can be engineered to have the desired temporal response and to exhibit a good linear range of current response.

The advantages of photodiode detectors have been demonstrated by p-i-n device structures fabricated in both Si and Ge. Known devices have generally required cryogenic operation because of smaller band gaps creating too many carriers at room temperature. The CdTe device with its 1.45 eV band gap has accordingly been the subject of continuing investigation because of its theoretical promise for room temperature operation. However, an ideally functioning CdTe p-i-n device has not been readily available due to problems associated with the quality of the intrinsic material, providing effective extrinsic p-type doping, and effecting good ohmic contacts.

SUMMARY OF THE INVENTION

Accordingly it is an object of the invention to provide an improved CdTe diode x-ray detector operable at room temperatures.

These and other objects of the invention are achieved in a novel p-i-n homojunction diode x-ray detector comprising three CdTe layers. The first layer is a high resistivity, intrinsic CdTe layer dimensioned for x-ray absorption, having two parallel faces. A photo-assisted molecular beam epitaxially (PAMBE) grown CdTe layer using a group III element as an n-type dopant is formed on one face of the intrinsic layers to create an n-i interface. In addition, a PAMBE grown CdTe layer using arsenic as a p-type dopant is formed on the other face of the intrinsic layer to create an i-p interface.

The use of the PAMBE process has been found to improve the structural quality of the epitaxial layers, and to facilitate activity on the part of the p- and n-dopant atoms.

In accordance with a further aspect of the invention, a semi-metallic contact layer of HgTe is formed on the p-dopant layer to facilitate a good ohmic contact and metal contacts are formed on the HgTe layer and on the n-doped layer to complete the detector.

The n-dopant may be one of several group III elements of which indium is preferable, and which permits use of an indium metal contact. The p-contact is typically gold, usually applied first in an "electroless" process, and then by evaporation to a greater thickness. The intrinsic CdTe region may be either of high resistivity bulk material, or it may be formed in situ on a suitable monocrystalline substrate by the PAMBE process.

DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
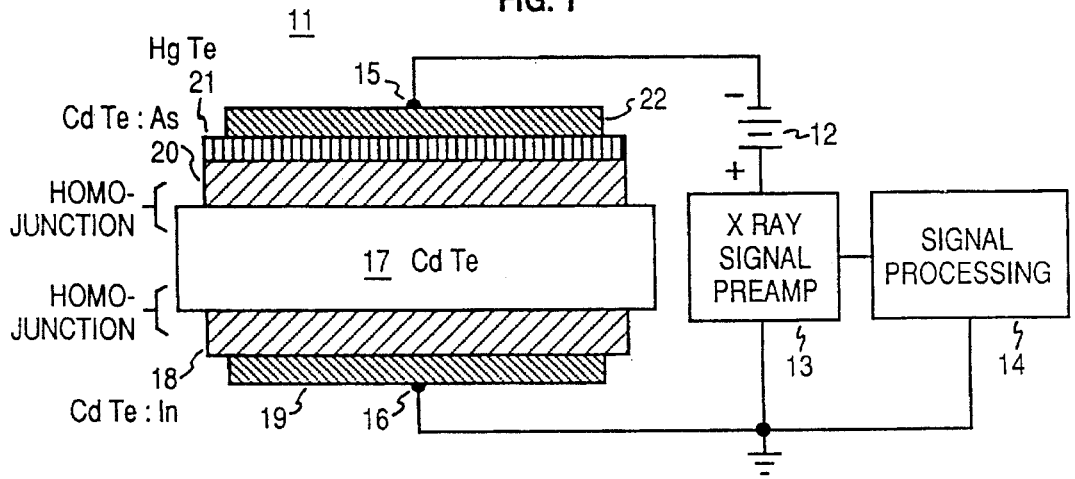
FIG. 1 is a cross-section of a p-i-n homojunction x-ray detector and an energization circuit in accordance with a first embodiment of the invention in which the x-ray absorption core is formed from commercially available high resistivity intrinsic cadmium telluride (CdTe) bulk material with photo-assisted molecular beam epitaxially (PAMBE) grown p and n doped CdTe layers arranged on opposite surfaces.

Referring to FIG. 1, a p-i-n homojunction x-ray detector in accordance with a first embodiment of the invention is shown. The p-i-n detector is designed to sense x-rays passing through the detector. The p-i-n detector 11 is electrically connected in series with a source 12 of dc potential (symbolized by a battery) poled to provide a reverse bias and an x-ray signal preamplifier 13 capable of sensing small ($10^{-9}$ ampere) currents. The output of the preamplifier 13 is supplied to signal processing means 14 typically the storage, computation, and display apparatus of a computed tomography system.

In the illustrated circuit, the negative terminal of the battery 12 is connected to the p terminal 15 of the p-i-n detector and the positive terminal of the battery is connected via the input network of the preamplifier 13 to the n terminal 16 of the p-i-n detector. In principle, the CdTe p-i-n device will support a substantial reverse bias, which, depending upon application, may be as low as a volt or as high as one or two hundred volts. A typical reverse bias, however, is on the order of 30 volts. The dark current levels are set in the nanoampere ($10^{-9}$) range, and a nominal dynamic range of $10^6$ is consistent with maximum signal currents of a few milliamperes when x-rays are being detected.

The reverse bias is established to adjust the thickness of the depletion layer and to expedite the transport of carriers out of the depletion region. The exact setting is achieved by a precision electronic network. Signal current sensing is performed by a high input impedance preamplifier 13. The preamplifier should have a large enough dynamic range to respond linearly to currents over the desired range from nanoamperes to milliamperes.

As earlier stated, the x-ray system, to which the p-i-n detector has application, is a computed tomography system in which a resolution on the order of 0.75 mm is desired, and in which a row of several hundred detectors are simultaneously exposed to x radiation. In this application, the traditional x-ray detectors have been Xenon gas detectors. In these detectors, the passage of an x-ray ionizes Xenon gas in a small chamber, which in the presence of a suitable dc bias causes a proportional current flow, which becomes a measure of the x-ray flux. More recent solid state detectors have used cadmium tungstate or other materials which scintillate to convert the x-rays to visible light. The visible light created by scintillation is then applied to light responsive photodiodes to obtain a measurement of the x-ray flux.

The present invention is designed for use in a computed tomography system of the same general nature described above. In the embodiments herein described, however, x-ray detection is achieved directly by p-i-n diodes, which produce currents proportional to the x-ray flux passing through them.

The p-i-n homojunction x-ray detector, which is illustrated in FIG. 1, comprises three semi-conducting layers and a semi-metallic layer based upon a CdTe core 17. The core, which is the central and thickest layer, provides the x-ray absorption region in which x-rays create carriers (holes and electrons) which will subsequently be collected and sensed. The layer 17 is formed of high purity, high resistivity, high crystalline quality "intrinsic" cadmium telluride. The core 17 is available from commercial suppliers having a (100) crystallographic orientation on both faces and in resistivities of from $10^7$ and higher ohm/cm. The (100) orientation provides equivalent structural and chemical properties on both faces and is a convenient orientation for forming the n and p doped CdTe epitaxial layers. The core 17 has a thickness of from two to three millimeters. This thickness is chosen to insure absorption of at least 90% of the impinging x-ray energy. The absorption of x-rays is accompanied by the creation of a succession of electron-hole pairs. These electron-hole pair are swept from the depletion region by the built-in voltage and bias voltage resulting in a measurable current.

The thickness of the core sets the upper limit on the "depletion" region, which is the region where carriers created by x-rays may be formed and collected. The working depletion region is also affected by the doping levels, thicknesses of the adjacent p and n type regions, and the potential differences applied between the terminals 15 and 16. The depletion layer ideally is equal to the thickness of the core.

The term "p-i-n homojunction" is used to imply that the three critical regions of the junction are of the same composition, i.e. cadmium telluride. Thus the intrinsic region is of high purity cadmium telluride and the n and p type regions also of cadmium telluride with n and p-dopants. (The term "homojunction" is intended not to extend to the metallic ohmic contacts, or to the layers such as HgTe which act as a secondary injector in enhancing a metallic ohmic contact.)

The selection of a p-i-n diode of cadmium telluride for x-ray detection provides the advantage of a relatively large average atomic number which provides greater absorption for a given thickness of material than other lighter materials. Cadmium has an atomic number of 40 and tellurium has an atomic number of 52.

A second advantage of CdTe is the 1.5 eV band gap which reduces the noise produced by thermally created carriers at normal ambient temperatures. Thus the detector may operate with excellent low noise performance without cooling to cryogenic temperatures. The advantage of using a homojunction is that it avoids the creation of potential barriers, which occur in certain known CdTe based structures, and which inhibit sensitive x-ray detection.

In forming the p-i-n homojunction x-ray detector, the n doped CdTe layer 18 is normally formed first following preparation of the intrinsic core for the epitaxial growth process. The layer 18 is formed by the photo-assisted molecular beam epitaxial (PAMBE) growth process. The PAMBE apparatus utilizes a molecular beam epitaxial apparatus containing a growth chamber in which a substrate may be supported in a vacuum environment, and heated to a desired growth temperature, usually about 200° C.

The substrate, a wafer of high resistivity intrinsic CdTe with (100) oriented faces, is then subjected to the simultaneous controlled effusions of up to three ovens. Oven materials may include cadmium telluride, cadmium, tellurium, and various dopants. Since the wafer must be removed from the MBE apparatus and turned over to expose its other face before the p-region is formed, a fourth oven, which may be used to provide the p-dopant is inactive.

In a preferred embodiment, the n-dopant is indium. At the same time that the thermally impelled molecular beams are impinging on the substrate, light from an argon ion laser operating with broad band yellow-green optics floods the substrate. Laser illumination during deposition has been shown to alter epilayer growth kinetics in such a way that improved structural properties over layers grown by conventional MBE are obtained. Assuming a deposition rate of a few angstroms per second, the impinging photon flux density should be several orders of magnitude higher than the atomic deposition rate. A laser power density of 75 mW per $cm^2$, corresponding to a photon flux density of about $2 \times 10^{17}$ per $cm^2$ per second has been found to be adequate for the above deposition rate.

A suitable doping level of the epilayer 18 is $10^{17}$ per cc and the suitable thickness is 10 microns. Other n-type dopants may be used such as gallium, but indium is preferred. The metal contact 19 may be additional indium or chrome, platinum, or palladium. Indium is currently preferred and to a depth of at least one micron depending upon the application.

Following the formation of the n-doped CdTe epilayer 18 resulting in the creation of the i-n interface, the sample is turned over to form the p-doped CdTe epilayer 20 and the p-i interface. A preferred dopant for the p-layer is arsenic. It is applied to the intrinsic CdTe wafer by the PAMBE process under similar conditions of illumination, substrate temperature, and effusion rates optimized for the p-dopant. Previous attempts to dope CdTe with arsenic using conventional MBE often resulted in electrically compensated material due to anti-site and/or interstitial incorporation of arsenic atoms. The PAMBE technique produces uncompensated material through enhanced incorporation of arsenic atoms on tellurium lattice sites where they act as acceptors. Thus, optimal electrical properties are achieved. The preferred doping level is approximately $10^{17}$ atoms per cc and the eventual thickness of the p-region is preferably about 10 microns.

With the p-doped epilayer 20 complete, the preferred next step is the provision also by the PAMBE process of a mercury telluride contact layer 21 which is a semi-metal compatible with the cadmium telluride, and which is readily given a final metal contact 22. The mercury telluride is laid down to a thickness of a fraction of a micron, and the final metal contact 22 is gold also applied to a thickness of at least one micron depending upon the application. The mercury telluride forms a portion of the contacting mechanism to the p-region, as earlier noted, acting as an injector, and facilitating an efficient ohmic connection to the gold contact 22.

Figure 2:
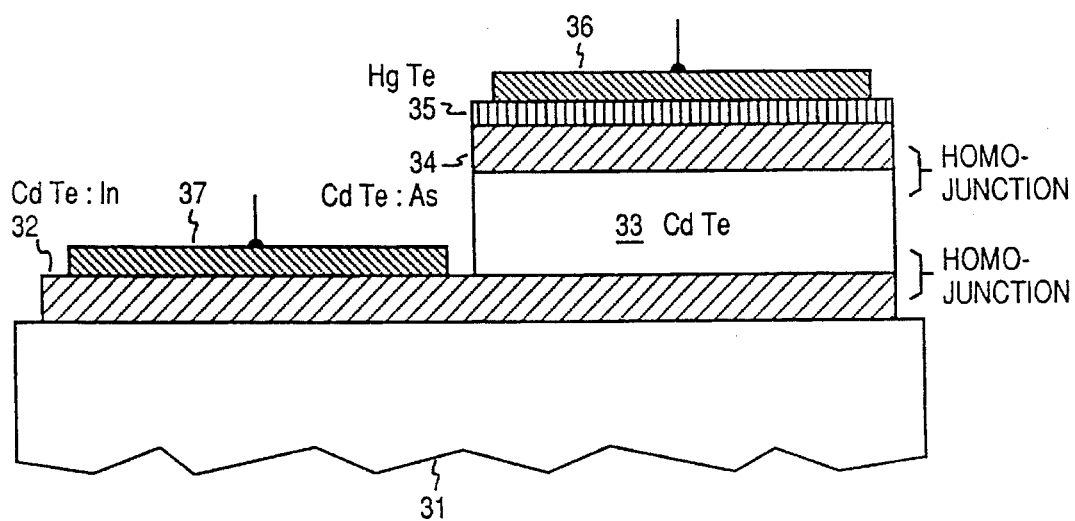
FIG. 2 is a cross-section of a p-i-n homojunction x-ray detector in accordance with a second embodiment of the invention in which the CdTe x-ray absorption core and both p- and n-doped CdTe layers are formed by a PAMBE growth process.

A p-i-n homojunction x-ray detector in accordance with a second embodiment of the invention is shown in FIG. 2. In this embodiment the absorption region of the p-i-n homojunction is also formed by the PAMBE growth process. The detector illustrated in FIG. 2 is grown upon a suitable substrate 31. A preferred substrate is a monocrystalline cadmium telluride wafer with (100) faces. The substrate, as will be seen, does not enter into the electrical operation of the crystal, but does affect the quality of the layers which are grown upon it.

After surface preparation, the substrate 31 is installed in the PAMBE apparatus, and an n-doped CdTe layer 32 is formed upon it to a depth of 10 microns. After this, the oven producing the n-dopant is shut down and an intrinsic CdTe layer 33 is formed to a thickness suitable for x-ray absorption. In the interests of faster growth it is desirable to use an MBE apparatus suitable for accelerated growth rates. The x-ray absorption path may be normal to the surface of the detector or perpendicular to the plane of the illustration thereby allowing growth of a thinner layer and making the absorption path equal to the width of the intrinsic region (measured normal to the plane of the drawing). After growth of a suitable thickness of the intrinsic region 33, the oven producing the p-dopant is activated to provide a p-region 34 that is approximately 10 microns thick. The p-region 34 is then capped with the PAMBE formed contact layer 35 of mercury telluride and the contact metal 36 is applied by a photolithographic process which omits the left half of the detector. At this point the layers 33, 34, and 35, the former being the thickest of the three, are removed by chemical and/or physical means down to the n-type CdTe layer 32, and a contact 37 is added by a photolithographically patterned step over the left half of the assembly.

The second embodiment exploits the improved material properties provided by the PAMBE growth technique in forming the x-ray absorption region 33, and insures high quality material throughout the detector. The contact to the n-doped layer 32 may also be formed in an alternate manner by removing the substrate 31 to expose the n-doped layer 32 at the interface with the substrate, and then applying the metal contact to the exposed layer. In this case, the thickness of the n-type region might be increased to improve process lattitude for substrate removal. The final structure will then be as is pictured in FIG. 1.

What is claimed:

1. A CdTe x-ray detector for use at room temperature comprising in combination

A) a high resistivity, intrinsic CdTe layer dimensioned for x-ray absorption, having two parallel faces, B) a photo-assisted molecular beam epitaxially (PAMBE) grown CdTe layer using a group III element as an n type dopant to form an n type layer and forming on one of said faces an n-i interface, said n type layer having a first metal contact, and C) a PAMBE grown CdTe layer using arsenic as a p-type dopant to form a p type layer and forming on the other of said faces an i-p interface, said p type layer having a second metal contact, said combination forming a CdTe p-i-n homojunction.

2. A CdTe x-ray detector as set forth in claim 1, wherein the second metal contact is gold, consisting of an electroless gold layer, over which additional gold is evaporated.

3. A CdTe x-ray detector for use at room temperature comprising in combination

A) a high resistivity, intrinsic CdTe layer dimensioned for x-ray absorption, having two parallel faces, B) a photo-assisted molecular beam epitaxially (PAMBE) grown CdTe layer using a group III element as an n type dopant to form an n type layer and forming on one of said faces an n-i interface, said n type layer having a first metal contact, C) a PAMBE grown CdTe layer using arsenic as a p-type dopant to form a p type layer and forming on the other of said faces an i-p interface,, said p type layer having a second metal contact, D) a PAMBE grown HgTe layer formed on said arsenic doped layer to enhance formation of an ohmic contact, said combination forming a CdTe p-i-n homojunction.

4. A CdTe x-ray detector as set forth in claim 3, wherein the second metal contact is gold, consisting of an electroless gold layer, over which additional gold is evaporated.

5. A CdTe x-ray detector as set forth in claim 4, wherein said n type dopant is indium, and said first metal contact is indium.

6. A CdTe x-ray detector as set forth in claim 5, wherein said two parallel faces have a (100) crystallographic orientation.

7. A CdTe x-ray detector as set forth in claim 6, wherein said intrinsic CdTe layer has a resistivity in excess of $10^7$ ohm centimeters, and a thickness of from 2 to 3 millimeters measured in a direction of x-ray propagation through said intrinsic CdTe layer.

8. A CdTe x-ray detector as set forth in claim 7, wherein said p and n type layers have doping levels on the order of $10^{17}$ per cc and thicknesses on the order of 10 microns; said doping levels, p and n type layer thicknesses and applied bias providing a depletion region optimized for x-ray absorption.

9. A CdTe x-ray detector as set forth in claim 3, wherein said intrinsic CdTe layer is PAMBE grown.

10. A CdTe x-ray detector for use at room temperatures comprising in combination A) a substrate suitable for epitaxial growth of CdTe material, B) a photo-assisted molecular beam epitaxially (PAMBE) grown CdTe layer using an n-type dopant, for forming an n-type layer on said substrate, the n-type layer having a metallic contact layer on a first surface portion thereof, and C) a high resistivity PAMBE formed intrinsic CdTe layer dimensioned for x-ray absorption grown on a second surface portion of said n type layer and forming an n-i interface, D) a PAMBE grown CdTe layer using arsenic as a p-type dopant for forming a p-type layer on said intrinsic CdTe layer and forming a p-i interface, E) a PAMBE grown HgTe contact layer formed on said p-type layer, and F) a metallic contact being formed on said HgTe contact layer, said combination forming a CdTe p-i-n homojunction.

11. A CdTe x-ray detector as set forth in claim 10, wherein said intrinsic layer has a resistivity in excess of 10 ohm centimeters, and a thickness suitable for x-ray absorption in a direction of x-ray propagation.

12. A CdTe x-ray detector as set forth in claim 11, wherein said p and n type layers have doping levels on the order of $10^{17}$ per cc and thicknesses on the order of 10 microns, said doping levels, p and n type thicknesses and applied bias providing a depletion region optimized for x-ray absorption.

13. A CdTe x-ray detector as set forth in claim 10, wherein said n type dopant is indium.

14. A CdTe x-ray detector for use at room temperature, comprising:

a first layer including intrinsic CdTe, the first layer having two parallel faces;

a second layer including CdTe and a group III element as an n type dopant for the second layer, the second layer forming with the first layer an n-i interface on one of the faces;

a third layer including CdTe and arsenic as a p type dopant for the third layer, the third layer forming with the first layer an i-p interface on the other of the faces;

a fourth layer including HgTe formed on the third layer;

a first metal contact for the fourth layer; and a second metal contact for the second layer, whereby a CdTe p-i-n homojunction is formed.

15. The detector as in claim 14, wherein the second metal contact is gold.

16. The detector as in claim 14, wherein the n type dopant is indium and the first metal contact is indium.

17. The detector as in claim 14, wherein the faces have a (100) crystallographic structure.

18. The detector as in claim 14, wherein the first layer has a resistivity in excess of $10^7$ ohm centimeters and a thickness of from 2 to 3 millimeters as measured in a direction of x-ray propagation through the first layer.

19. The detector as in claim 14, wherein the second and third layers each have doping levels on the order of $10^{17}$ per cc and thicknesses on the order of 10 microns, wherein the doping levels, thickness of the second and third layers and an electrical bias applied between the first and second metal contact provide a depletion region of the first layer for optimizing x-ray absorption.

* * * * *